(12) United States Patent
Paumier et al.

(10) Patent No.: US 8,126,022 B2
(45) Date of Patent: Feb. 28, 2012

(54) ELECTRONIC MULTIMODE DATA SHIFT DEVICE, IN PARTICULAR FOR CODING/DECODING WITH AN LDPC CODE

(75) Inventors: Laurent Paumier, Grenoble (FR); Vincent Heinrich, La Tronche (FR)

(73) Assignee: STMicroelectronics SA, Montrouge (FR)

( * ) Notice: Subject to any disclaimer, the term of this patent is extended or adjusted under 35 U.S.C. 154(b) by 965 days.

(21) Appl. No.: 12/117,060

(22) Filed: May 8, 2008

(65) Prior Publication Data

US 2008/0304614 A1    Dec. 11, 2008

(30) Foreign Application Priority Data

May 11, 2007    (FR) ..................... 07 55038

(51) Int. Cl.
*H04J 3/04* (2006.01)
*G06F 7/00* (2006.01)

(52) U.S. Cl. .................... 370/535; 708/209
(58) Field of Classification Search .......... None
See application file for complete search history.

(56) References Cited

U.S. PATENT DOCUMENTS

| | | | | |
|---|---|---|---|---|
| 4,829,460 A * | 5/1989 | Ito | ................. | 708/209 |
| 5,130,940 A * | 7/1992 | Omote | ................. | 708/209 |
| 5,262,971 A * | 11/1993 | Yamaguchi | ................. | 708/209 |
| 5,465,223 A * | 11/1995 | Nishimura | ................. | 708/209 |
| 6,006,244 A | 12/1999 | Mahurin | ................. | 708/209 |
| 6,590,900 B1 * | 7/2003 | Peting et al. | ................. | 370/428 |
| 7,464,255 B1 * | 12/2008 | Tan et al. | ................. | 712/300 |
| 2003/0131029 A1* | 7/2003 | Bandy et al. | ................. | 708/209 |
| 2006/0036933 A1 | 2/2006 | Blankenship et al. | ........ | 714/801 |
| 2006/0251207 A1* | 11/2006 | Paumier et al. | ................. | 377/64 |
| 2007/0089019 A1 | 4/2007 | Tang et al. | ................. | 714/752 |

OTHER PUBLICATIONS

Olcer, S., "Decoder Architecture for Array-Code-Based LDPC Codes," Dec. 1, 2003, pp. 2046-2050.
Rovini, M. et al., "VLSI Design of a High-Throughput Multi-Rate Decoder for Structured LDPC Codes," Aug. 2005, pp. 202-209.

* cited by examiner

*Primary Examiner* — Steven H Nguyen
(74) *Attorney, Agent, or Firm* — Allen, Dyer, Doppelt, Milbrath & Gilchrist, P.A.

(57) ABSTRACT

An electronic device includes N inputs to receive R input data, R being able to take values from 1 to N, and N outputs. A configurable shift circuit is coupled between the N inputs and N outputs and has a cascade of shift stages, each shift stage comprising at least N controllable multiplexers. Each multiplexer includes first and second elementary inputs respectively coupled to a first input and a second input taken from among the N inputs so as to, on command, not shift a data item present on the first elementary input and shift a data item present on the second elementary input by an elementary shift value dependent on a rank of the shift stage, a direction of the shift being identical for each multiplexer. Control circuitry controls the multiplexers to deliver the R input data on R outputs.

25 Claims, 17 Drawing Sheets

ELECTRONIC MULTIMODE DATA SHIFT DEVICE, IN PARTICULAR FOR CODING/DECODING WITH AN LDPC CODE

FIELD OF THE INVENTION

The invention relates to data shift devices which are, in particular, used to perform a cyclic permutation of input data.

Such devices are, for example, used in a non-limiting manner in channel coding devices including encoders using codes based on blocks whose parity matrix exhibits a low density, and, which are better known to one of ordinary skill in the art by the term "LDPC code" ("Low Density Parity Check"). Such devices may also be used in channel decoding devices including LDPC decoders, or in devices using turbo codes to perform a part of the data interlacing. Such codes are proposed for numerous standards (802.11n, 802.16e, DVB-S2, etc.). The emergence of these numerous standards may require hardware flexibility and hardware reconfigurability of these data shift devices.

BACKGROUND OF THE INVENTION

Conventional data shift devices are known by one of ordinary skill in the art by the term barrel shift circuits ("barrel shifters"). These barrel shift circuits are based on a logarithmic architecture of multiplexers and, when they are of size N (that is to say exhibiting N inputs and N outputs), they offer a simple approach for performing a cyclic shift of N data delivered as inputs to the circuit by a bus of size N. On the other hand, when only a part of the data bus is used, that is to say when the barrel shift circuit is fed with a smaller number of inputs than N, the outputs of the barrel shift circuit, on which the shifted data are delivered, vary according to the desired shift value. Stated otherwise, the "output wires" actually used, that is to say conveying the shifted output data, are not the same, for a given bus size, depending on the shift value. This may not be advantageous when connecting another circuit downstream of the barrel shift circuit.

So, it is seen straight away that these barrel shift circuits do not offer a satisfactory approach to the hardware flexibility and hardware reconfigurability mentioned above and used in order to satisfy the emergence of different standards, unless of course one uses as many barrel shift circuits as there are sizes of bus to be envisaged, employing an appropriate selection device, or else a single barrel shift circuit exhibiting the maximum size with a complex wire routing device, downstream, that can be configured as a function of the real size of the input data bus.

Now, these two approaches exhibit a not inconsiderable surface area and/or complex routing problems.

SUMMARY OF THE INVENTION

According to an embodiment there is a shift device making it possible to support any bus size from 1 to N, thus offering a totally reconfigurable device. According to another aspect, there is an electronic shift device capable of shifting data by a desired overall shift value, comprising N inputs able to simultaneously receive R input data, R being able to take all the values from 1 to N.

The device also comprises N outputs, a configurable shift circuit connected between the N inputs, the N outputs, and a cascade of shift stages. The number of stages depends on N and each stage comprises at least N controllable multiplexing means or circuitry.

Each multiplexing means or circuitry of a stage possesses a first elementary input and a second elementary input respectively connected directly or indirectly, for example by way of one or more other multiplexing means or circuitry, to a first input and to a second input taken from among the N inputs so as to, on command, not shift a data item present on the first elementary input and shift a data item present on the second elementary input by an elementary shift value which depends on the rank of the stage. Moreover, the direction of shift, right shift or left shift, is identical for all the multiplexing means or circuitry. The electronic shift device also comprises control means or circuitry able to control the various multiplexing means or circuitry so as to deliver the R input data on R predetermined outputs whatever the desired overall shift value which is less than R.

According to an embodiment, the shift circuit comprises two parts, one being able to be likened, from the point of view of the number of multiplexing means or circuitry, to a conventional barrel shift circuit. On the other hand, from a connectivity point of view, it may be a modified barrel circuit since the multiplexing means or circuitry of this first part are connected so as to optionally always shift in the same direction.

The shift circuit also comprises a second part able to optionally include additional multiplexing means or circuitry. With regard to the control of the multiplexing means or circuitry, this is more complex than for a conventional barrel shift circuit since the multiplexing means or circuitry of a given shift stage are not necessarily controlled in the same manner.

Thus, according to an embodiment, the shift circuit is, with regard to the control of the multiplexing means or circuitry, divided virtually into two parts which are not necessarily the same two parts mentioned previously, the boundary between these two parts depending on the value S+N−R, where S denotes the desired overall shift value.

Thus, according to an embodiment, each shift stage comprises a first group of adjacent multiplexing means or circuitry and a second group of adjacent multiplexing means or circuitry, the number of multiplexing means or circuitry in each group depending on the rank of the stage and the value S+N−R where S denotes the desired overall shift value, and the control means or circuitry are able to control in an independent manner the two groups of multiplexing means or circuitry of each stage, and in an identical manner all the multiplexing means or circuitry of a group of a stage, in such a way that the multiplexing means or circuitry of all the first groups effect a total shift equal to S and that the multiplexing means or circuitry of all the second groups effect a total shift equal to S+N−R.

If the input data are coded in a single bit, each multiplexing means or circuitry is in fact a multiplexer. On the other hand, if the input data are coded in several bits, each multiplexing means or circuitry is a set of several multiplexers connected in parallel and respectively associated with the data bits. Each set of multiplexers is controllable in an individualized manner and all the multiplexers of one and the same set are controlled in an identical manner.

The shift device can, for example, be embodied in the form of an integrated circuit. According to another aspect, there is also a channel coding device, in particular able to perform an encoding with an LDPC code, incorporating a shift device such as defined above.

According to yet another aspect, there is also a channel decoding device, in particular able to perform a decoding of blocks encoded with an LDPC code, incorporating a shift device such as defined above.

BRIEF DESCRIPTION OF THE DRAWINGS

Other advantages and characteristics of the invention will appear on examining the detailed description of wholly non-limiting embodiments and the appended drawings in which.

DETAILED DESCRIPTION OF THE PREFERRED EMBODIMENTS

Figure 1:
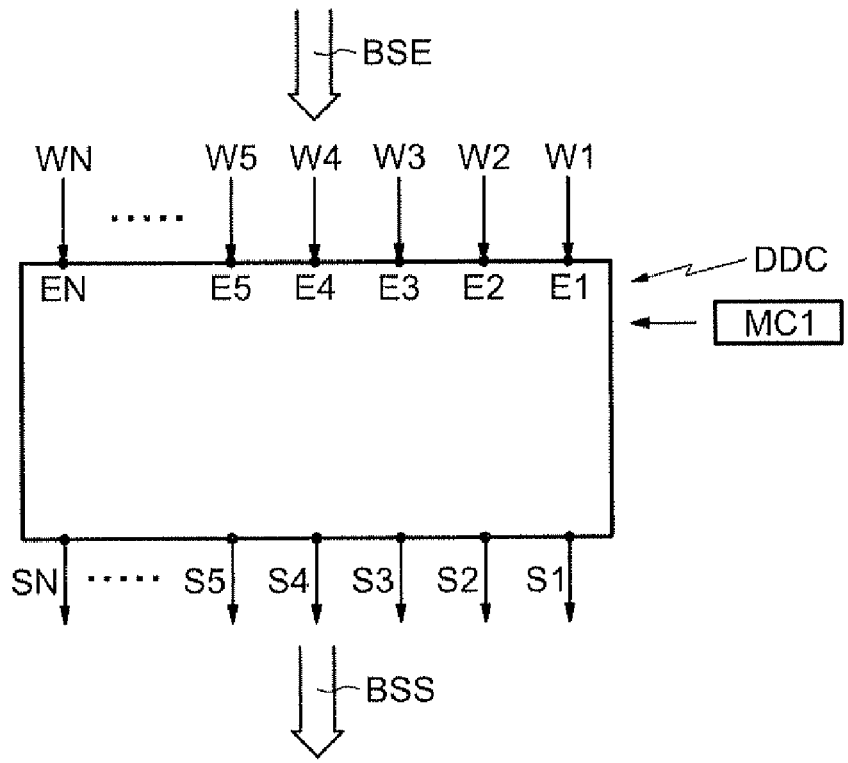
FIG. 1 schematically illustrates an embodiment of a data shift device according to the present invention.
Figure 2:
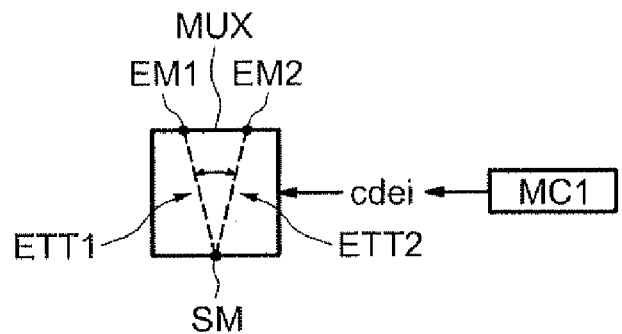
FIG. 2 schematically illustrates a multiplexing means or circuitry according to the present invention.

In FIG. 1, the reference DDC denotes an electronic shift device comprising N inputs E1-EN and N outputs S1-SN. The device DDC is able to receive data Wi originating from an input bus BSE, and to deliver shifted data on an output bus BSS. As will be seen in greater detail hereinafter, the organization of these data able to be received at the input of the device DDC can be different.

Thus, for example, the device DDC can receive simultaneously N data W1-WN organized, for example, into a single group, or else a group of data whose size can take an arbitrary value greater than or equal to 1 and less than N.

Stated otherwise, the device DDC is a multimode device in the sense that it is capable of handling the case of a bus BSE of size N, that is to say of simultaneously receiving R=N data at input, or else the case of buses of intermediate size, that is to say of receiving as input on the bus BSE a number R of data that is less than N and greater than or equal to 1.

Whatever the organization of the input data, the device DDC may deliver the shifted output data on predetermined outputs of the device DDC, doing so whatever the envisaged overall shift value compatible with the organization of the input data. Thus, an exemplary overall shift value S compatible with an input organization is a shift value S less than the size R of the group of data received.

The shift device DDC also comprises control means or circuitry MC1 able to control the various multiplexing means or circuitry so as to deliver the R input data on R predetermined outputs whatever the overall shift value S desired which is less than R.

More particularly, each multiplexer MUX comprises a first elementary input EM1 and a second elementary input EM2, as well as an output SM. According to the value of the control signal $cde_i$ delivered by the control means or circuitry MC1, the first elementary input EM1 or the second elementary input EM2 may be linked to the output SM.

When the first elementary input EM1 is linked to the output SM, the multiplexer MUX is in a first state ETT1 in which, as will be seen in greater detail hereinafter, it does not shift a data item present on the first input EM1.

On the other hand, when the second elementary input EM2 is linked to the output SM, the multiplexer MUX is in a second state ETT2 in which it shifts a data item present on this second elementary input by an elementary shift value which depends on the rank of the shift stage of the shift circuit.

Reference is now made more particularly to FIGS. 3 to 16 to describe in greater detail a first variant embodiment relating to a shift device DDC able to perform a shift of the data to the left.

In the examples described here, for a group of R data (R less than or equal to N and greater than or equal to 1) arriving at the R inputs E1 to ER of the shift device DDC, the R predetermined outputs on which the shifted data may be output, whatever the overall shift value S desired, are the R outputs of rank 1 to R referenced S1 to SR.

Figure 3:
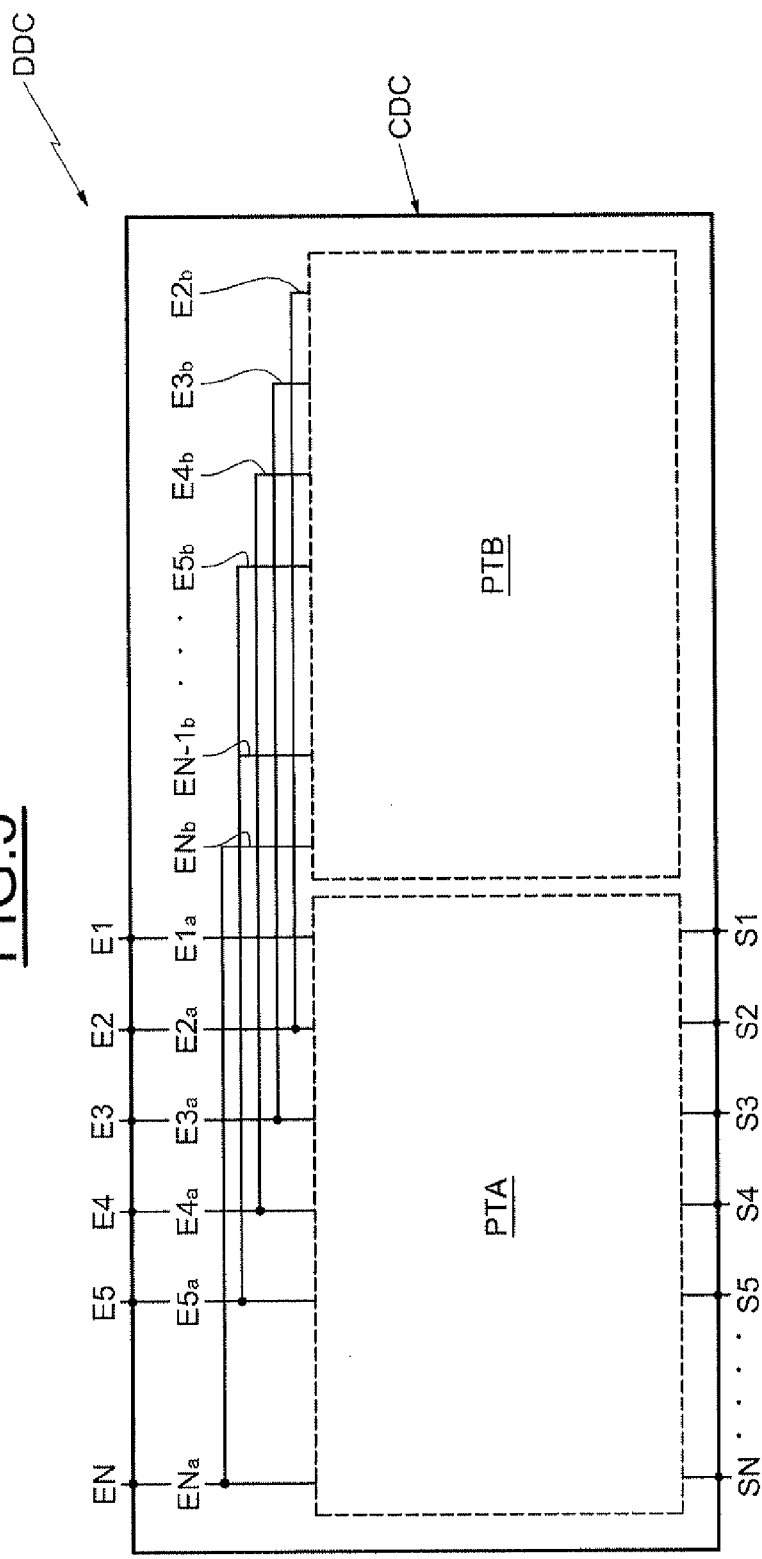
FIGS. 3 and 4 schematically illustrate more particularly, an embodiment of a shift circuit incorporated into the data shift device of FIG. 1.
Figure 4:
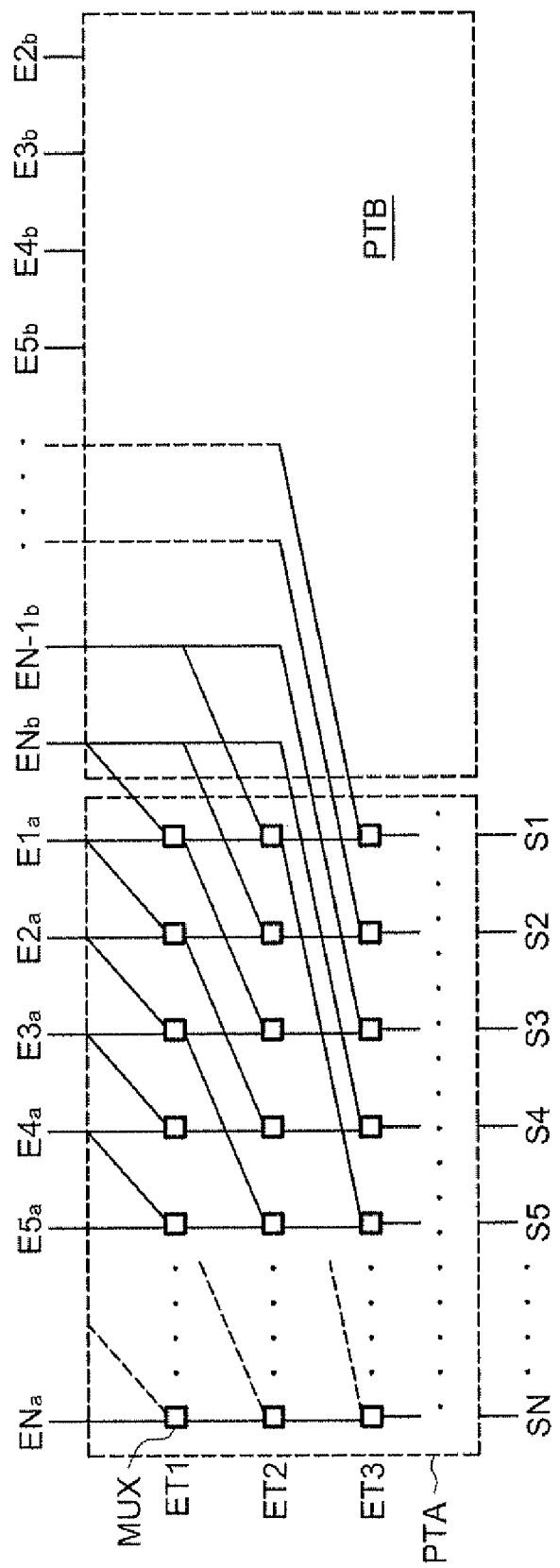

As seen more particularly in FIGS. 3 and 4, the shift circuit CDC comprises a first part PTA having a regular architecture and a second part PTB. The shift circuit CDC comprises a cascade of shift stages $ET_i$, the number of which is dependent on N. More particularly, the number of shift stages is equal to $ceil(log_2(N))$, where $ceil(X)$ denotes the integer part greater than X function. In the part PTA of the shift circuit CDC with regular architecture, each shift stage comprises N multiplexers MUX.

Moreover, a shift stage of rank i in the cascade comprises an additional number of multiplexers disposed in the part PTB. This number may optionally be zero and depends in a general way on the rank i of the stage as well as the number N.

More precisely, each shift stage thus comprises in total a number of multiplexers equal to $N+2^i \cdot floor((N-2^{i-1}-1)/2^i))$, where $floor(X)$ denotes the integer part less than X function and i denotes the rank of the stage, the first stage being the stage of rank i equal to 1.

All these multiplexers are able to shift in the same direction of shift (here to the left). It thus emerges from this formula and from the number of shift stages that the last stage of the cascade comprises only N multiplexers, that is to say this last shift stage does not comprise additional multiplexer disposed in the part PTB.

Moreover, as seen more particularly in FIG. 3, out of the N inputs E1-EN of the device DDC, N−1 inputs are in fact split. Here they are the N−1 inputs of rank 2 to N. Only the first input of rank 1, referenced E1, is not split.

Stated otherwise, from the standpoint of the level of the shift circuit CDC, the latter comprises at the level of the part PTA, N inputs that may here be dubbed intermediate inputs, and referenced $E1_a$-$EN_a$. These N intermediate inputs correspond to the N inputs E1-EN. The N−1 intermediate inputs $E2_b$-$EN_b$ which correspond virtually to the inputs of the second part PTB of the circuit CDC are at least for some among them respectively linked to the N−1 corresponding inputs $E2_a$-$EN_a$, and consequently to the N−2 inputs E2-EN.

This is the reason why one speaks of a "splitting" of the N−1 inputs E2-EN while only the input of rank 1, that is to say the input E1 is not split. In fact, as will be seen in greater detail hereinafter, and in particular in various examples, for the first stage, and, if only the first part PTA is considered, only the input of rank N, EN, is split.

For the stage of rank 2, and, if only the first part PTA is considered, the first two inputs starting from the left, that is to say the inputs EN and EN−1 of rank N and N−1, are split. More generally, for the stage of rank I, and, if only the first part PTA is considered, the first $2^{i-1}$ inputs starting from the left are split, that is to say they are connected to two multiplexers of different ranks of this stage of rank i.

Moreover, since the size of the bus BSE can take all the values between 1 and N, each of the N input data has the possibility of being present on each of the N outputs S1-SN. Thus, in the present case, the data item present on the input $EN_a$ may only be present on the output SN. Therefore, this data item which is also present on the input $EN_b$ may be able to be present on the outputs S1, S2, ..., SN−1. Consequently, the input data item present on the input $EN_b$ may be capable of being shifted leftwards by a shift value equal to 1, 2, 3, ..., or N−1.

Likewise, with regard to the direction of shift, the data item present on the input $EN-1_a$ may only be present on the outputs SN or SN−1. Therefore, this data item present also on the input $EN-_b$ may be able to be capable of being present on the outputs S1, S2, ..., SN−2. Consequently, the data item present on the input $EN-1_b$ may be able to be shifted leftwards by a shift value equal to 2, 3, ..., or N−1.

The data item present on the input E3, can be present on one of the outputs S3 to SN. Thus, the data item present on the input $E3_b$ may helpfully be able to be present on the output S1 or S2. Consequently, the data item present on the input $E3_b$ may be able to be shifted leftwards by N−2 or by N−1.

Finally, the data item present on the input $E2_a$ can be present on any one of the outputs S2 to SN. Thus, the data item present on the input $E2_b$ may helpfully be able to be present on the output S1. Consequently, the data item present on this input $E2_b$ may be able to be shifted leftwards by N−1. More generally, the data item present on the input $Ej_b$ may advantageously be able to be shifted leftwards by N−1, N−2, ..., or n−j+1. The architecture of the shift circuit CDC comprising the first part PTA and the second part PTB makes it possible to effect these various shifts as will now be explained in greater detail in more particular exemplary embodiments.

As indicated above, whatever the part of the shift circuit CDC, all the multiplexers MUX are able to shift a data item in the same direction of shift, here to the left. Stated otherwise, the second elementary input EM2 of a multiplexer of rank r may be connected, directly or else indirectly by way of at least one other multiplexer, to an input Eq of rank q that is different from the rank of the multiplexer, for example of lower rank.

Stated otherwise, this is depicted graphically in FIGS. 4 to 12 which illustrate left shifts, by a right slanting connection of the second elementary inputs of all the multiplexers MUX.

Moreover, each multiplexer of a shift stage of rank i is able to shift by way of the second elementary input, a data item by an elementary shift value which may be identical for all the multiplexers of this stage. This elementary shift value is equal to $2^{i-1}$ for a stage of rank i, the first stage being the stage of rank i equal to 1.

Moreover, as explained above in different terms, the second elementary inputs of all the multiplexers of a shift stage are respectively connected directly or indirectly to inputs of consecutive ranks, it being understood that rank N is considered to be consecutive to rank 1. This is illustrated in the exemplary embodiments of FIGS. 5 to 12.

In these figures, for simplification purposes, the inputs E1-EN and the outputs S1-SN are represented solely by the number of their rank 1 to N. Thus, in FIG. 5, which illustrates the case N=3, the second elementary inputs of the multiplexers of ranks 3, 2 and 1 of the stage ET1 are respectively tied to the inputs of consecutive ranks 2, 1 and 3.

Figure 6:
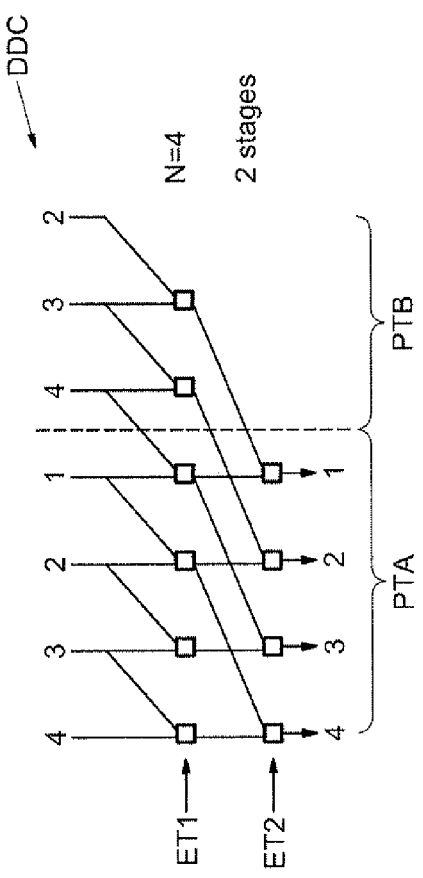
FIGS. 5 to 18 illustrate various embodiments and modes of operation of a data shift device according to the present invention.
Figure 5:
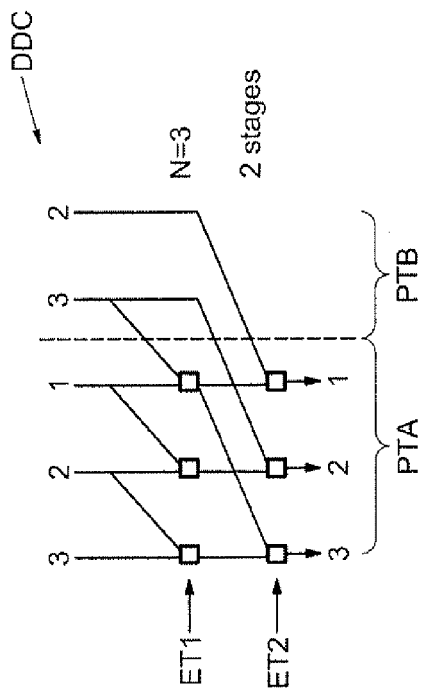
Figure 7:
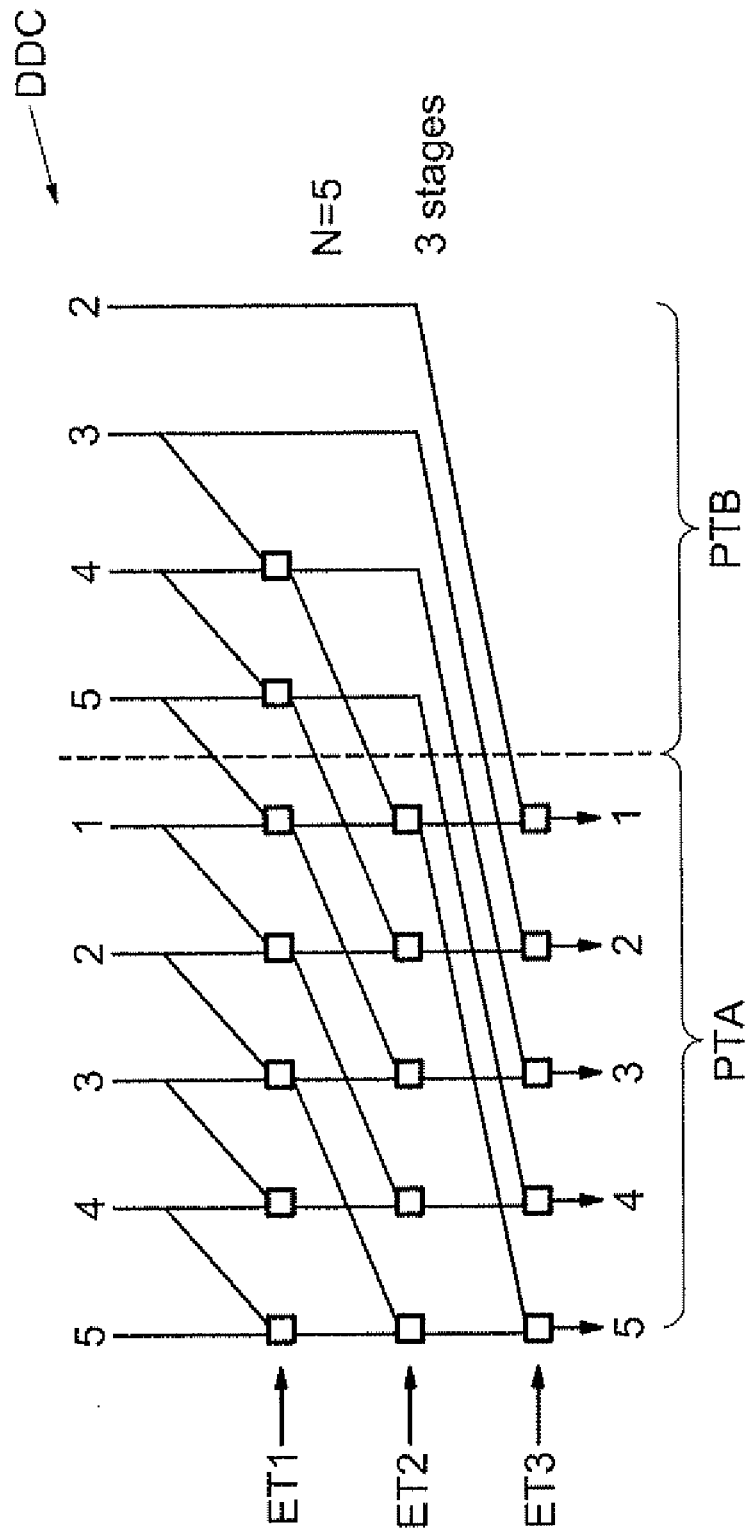
Figure 8:
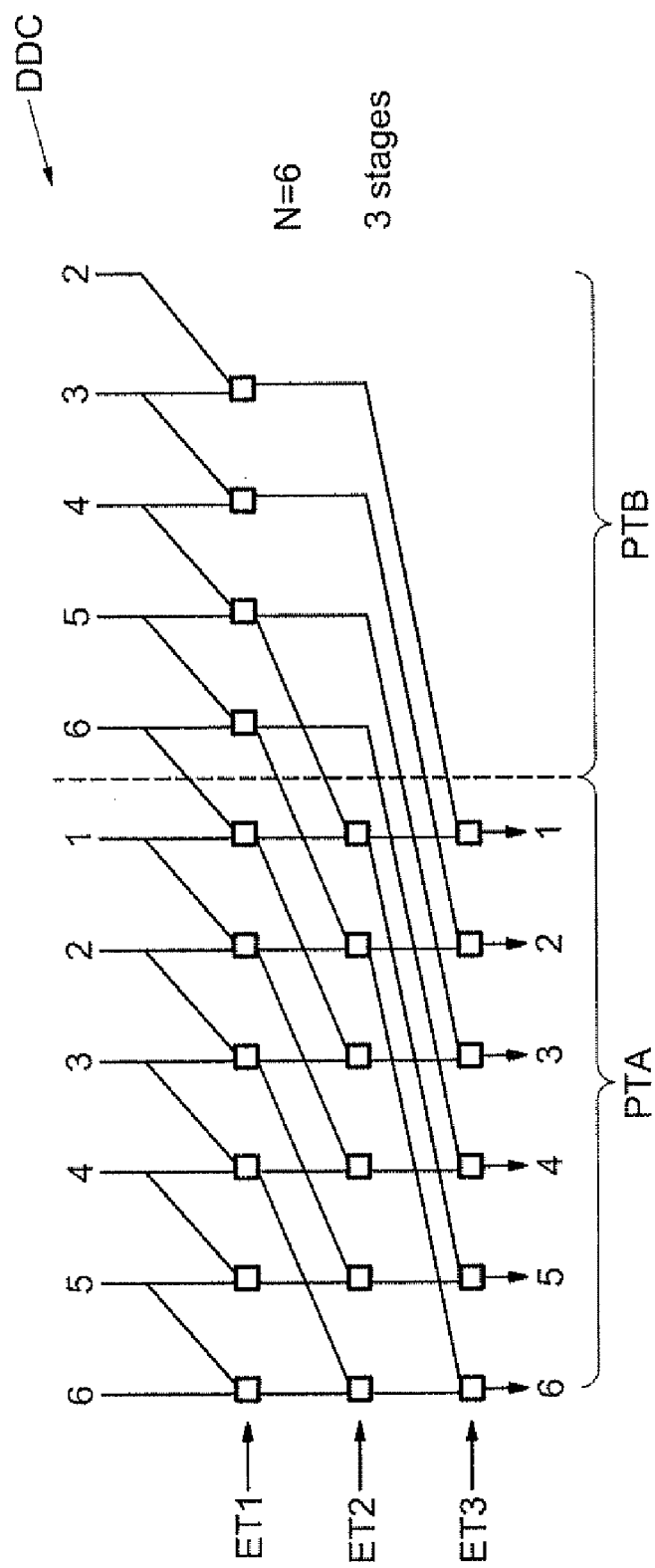

Likewise, the second elementary inputs of the multiplexers of ranks 3, 2 and 1 of the second stage ET2 are respectively linked to the inputs of consecutive ranks 1, 3 and 2. In the case of FIG. 6, the device DDC is a device envisaged for N=4. The second elementary inputs of the adjacent multiplexers of the stage ET1 (part PTA and part PTB) are respectively linked to the inputs of consecutive ranks 3, 2, 1, 4, 3, 2.

The second elementary inputs of the four multiplexers of the part PTA of the last stage ET2 are respectively linked indirectly to the inputs of consecutive ranks 2, 1, 4, 3. The same principle is repeated in FIGS. 7 to 12 which respectively illustrate shift devices DDC for values of N=5, 6, 7, 10, 11 and 13.

Moreover, as may be seen in these figures, a single of the N inputs may be connected directly to two different multiplexers while each of the other N−1 inputs of successive ranks may be connected directly to at least three different multiplexers in such a way that a data item present on one of these other N−1 inputs may be shifted in the direction of shift by any overall shift value less than N and compatible with the rank of the input.

More precisely, in the examples described here, the other N−1 inputs are the inputs of ranks 2 to N and each of these inputs is may be connected directly to at least three different multiplexers in such a way that a data item present on one of these inputs may be shifted in the direction of shift by any overall shift value lying between N−1 and N−r+1, where r denotes the rank of the input. In these examples, the input which is connected directly to two different multiplexers is the input of rank 1.

Figure 9:
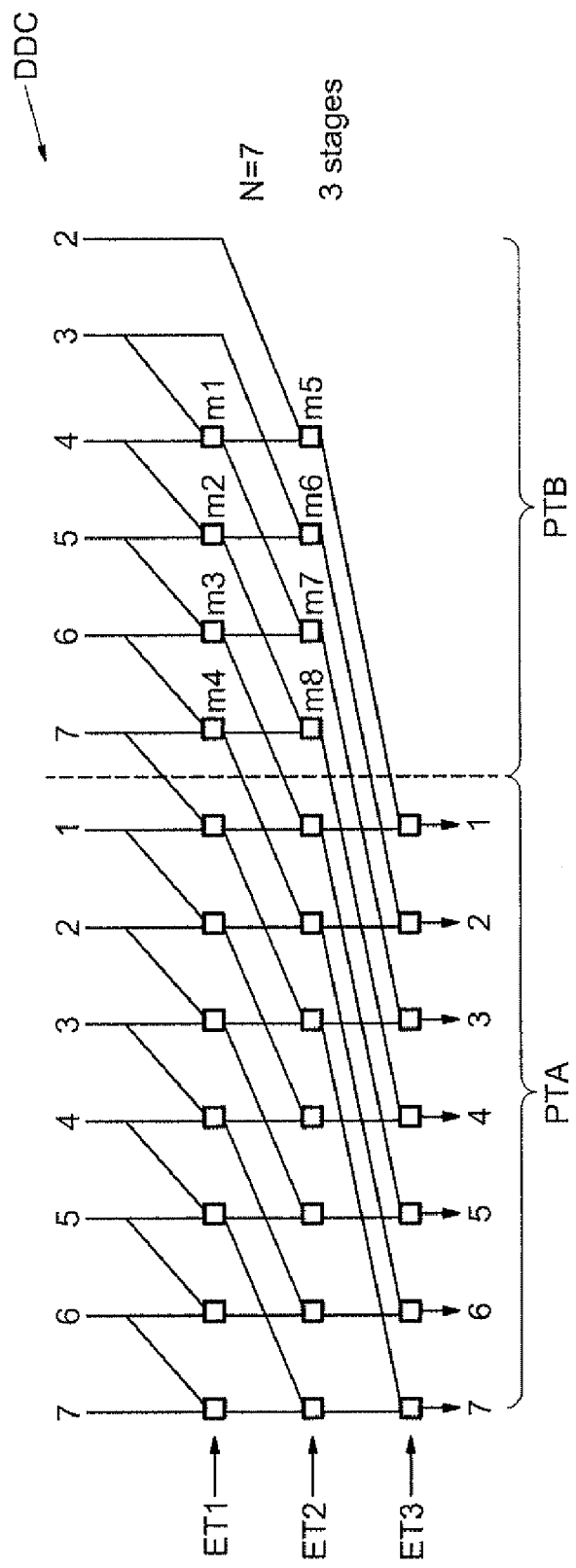
Figure 10:
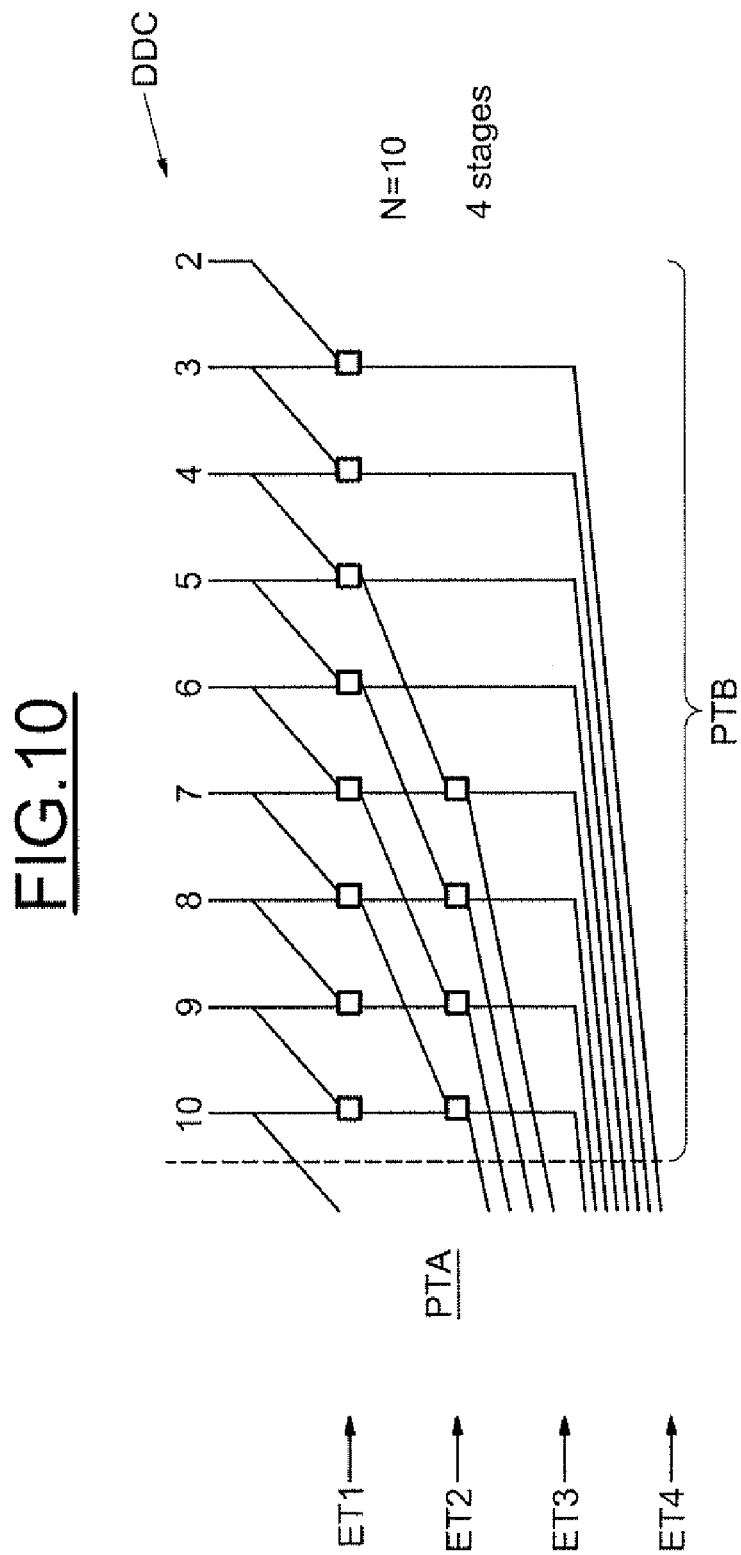
Figure 11:
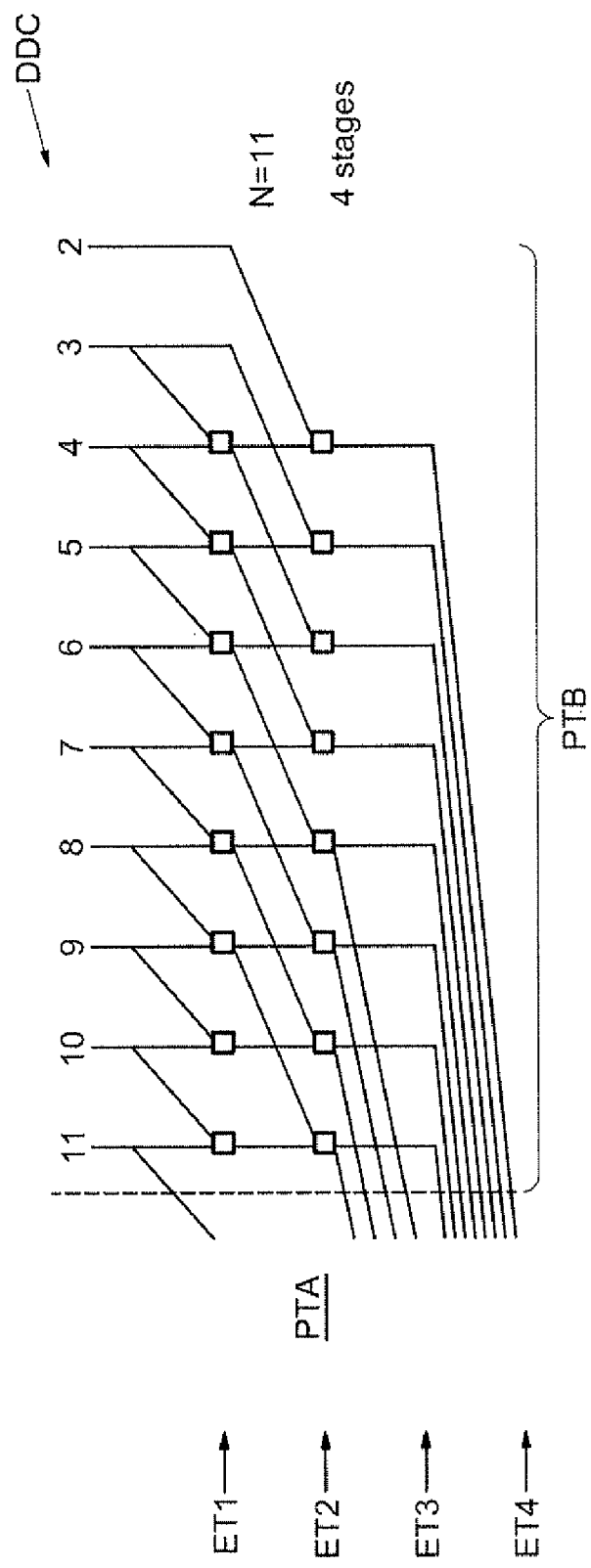
Figure 12:
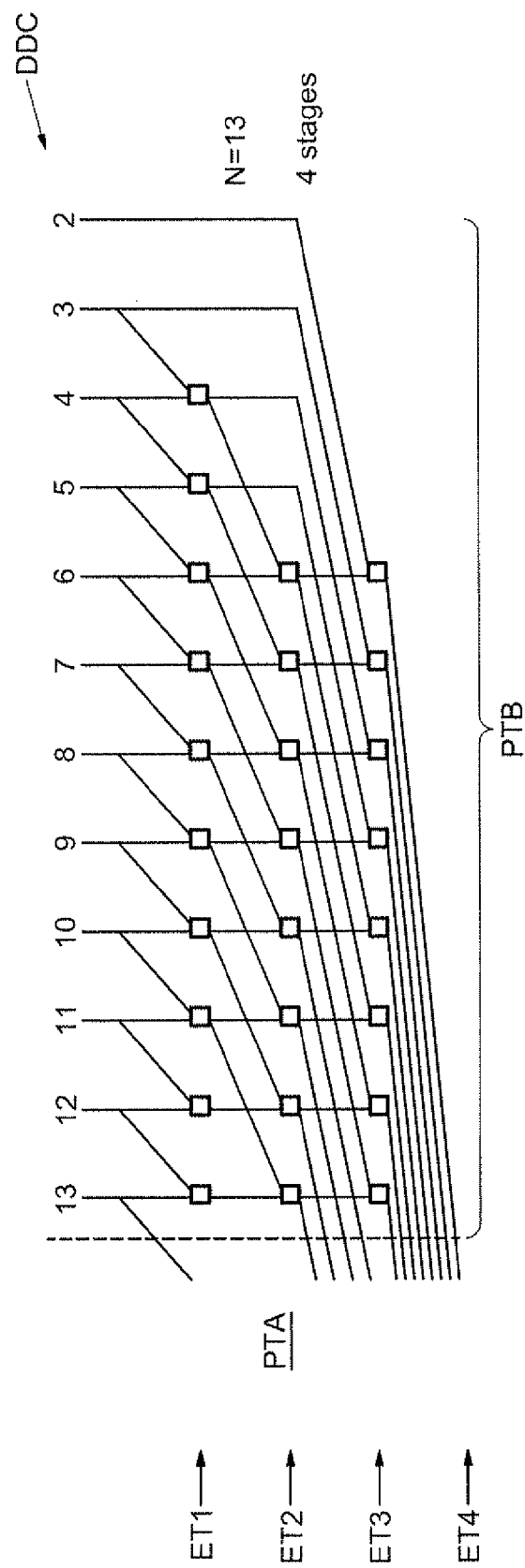

Referring once again to the examples, and for example to FIG. 9, which illustrates the case N=7, the input of rank 2 connected to the part PTB may be able to be shifted to the left by a shift value equal to 6. Consequently, since the second stage ET2 shifts by an elementary shift value equal to 2 and the third stage ET3 shifts by an elementary shift value equal to 4, it is helpful here to insert a multiplexer m5 at the level of the stage ET2, whose first elementary input is connected indirectly by way of the multiplexer m1 to the input of rank 4, and whose second elementary input is connected to the input of rank 2. The output of this multiplexer m5 is connected to the second elementary input of the multiplexer of rank 1 of the stage ET3.

The data item of rank 3 at the level of the part PTB may be able to be shifted by an overall shift value equal to 6 or 5. Since 5 is an odd value, an elementary shift of 1 is helpful at the level of the first stage, hence the presence of the multiplexer m1 whose first elementary input is connected to the input of rank 4 and whose second elementary input is connected to the input of rank 3. An elementary shift of 2 is also used to perform the overall shift of 6, thus using the presence of the multiplexer m6 at the second stage ET2.

The input of rank 4 may be able to be shifted by an overall shift value equal to 6, 5 or 4. An overall shift value equal to 4 is obtained by virtue of the multiplexers of the part PTA of the circuit CDC. On the other hand, to achieve an overall shift value equal to 5 or 6, an elementary shift of 1 or of 2 is helpful. This is the reason why there is provision here to insert additional multiplexers m2 and m7 respectively at the first stage ET1 and at the second stage ET2.

The same reasoning is continued for the other inputs, thereby actually leading to the architecture illustrated in FIG. 9. In a more general manner, in the examples described here for a left shift, the first elementary inputs of the N multiplexers of rank 1 to N of a stage of rank i are respectively connected directly or indirectly to the N inputs of rank 1 to N.

The second elementary input of the multiplexer of rank 1 of the stage of rank 1 (that is to say the first stage) is connected to the input of rank N.

The first and second elementary inputs of the possible other multiplexing means or circuitry of the stage of rank i, that is to say the possible multiplexers of the part PTB, are connected directly or indirectly to some at least of the inputs of rank N to 2 with regard to the elementary shift value associated with this stage.

The second elementary inputs of some of the N multiplexers of the last stage are also connected directly or indirectly to the inputs of rank N to 2 with regard to the elementary shift value associated with this stage. The control of the multiplexers of the various stages is illustrated in two particular examples (FIGS. 13 and 14 on the one hand, FIGS. 15 and 16 on the other hand).

Figure 13:
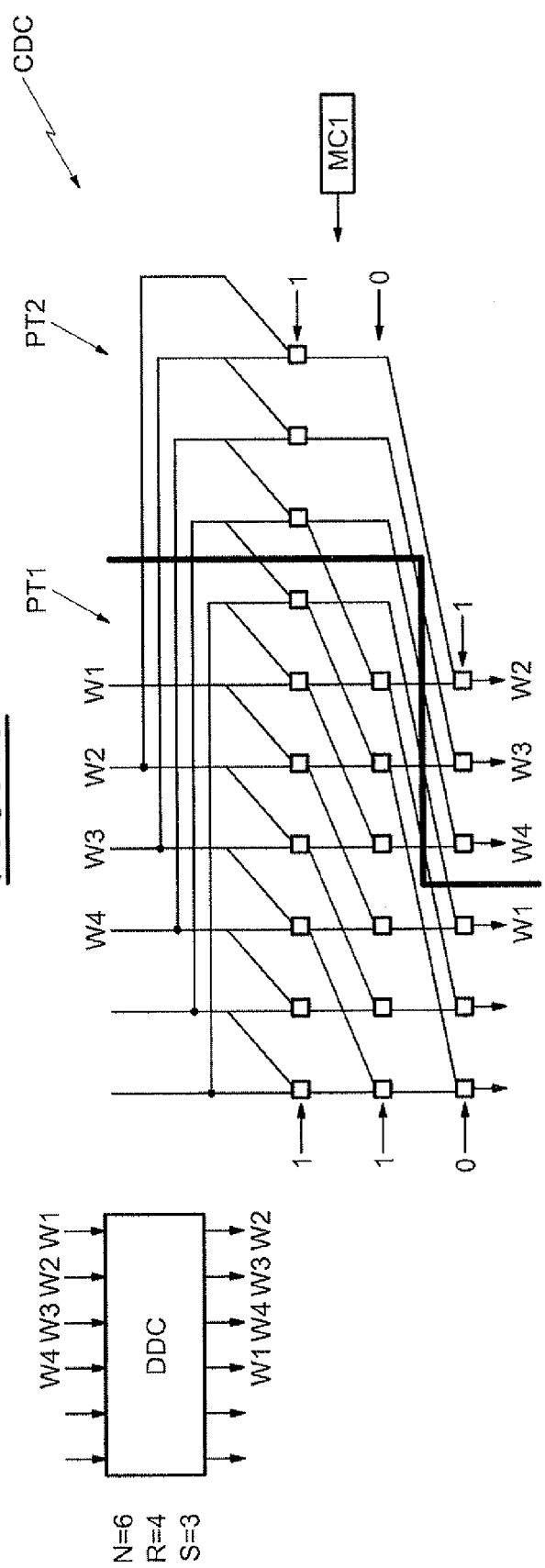
Figure 15:
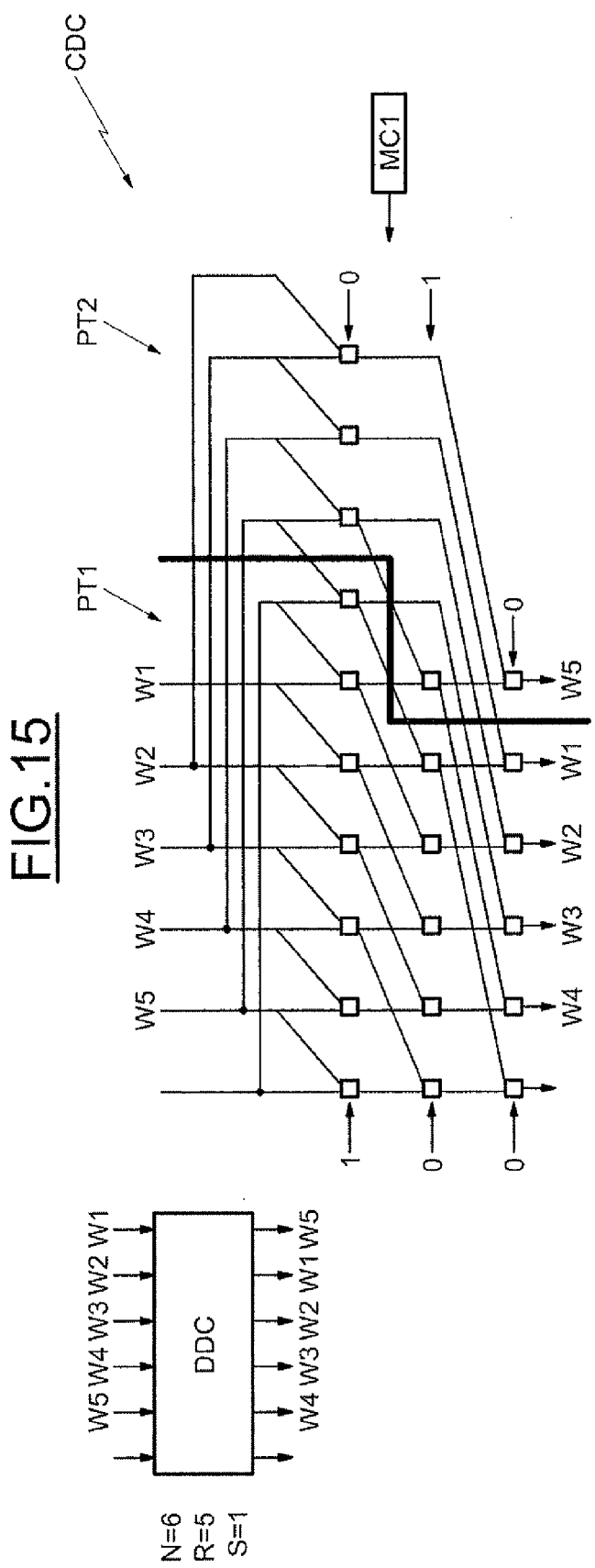

In fact, as seen in these figures, and especially in FIGS. 13 and 15, the graph of the shift circuit CDC is divided into two parts PT1 and PT2, which depend on the value S+N−R where S denotes the overall shift value, and R the actual number of data received on the bus BSE, that is to say the size of the bus BSE.

The multiplexers of the first part PT1 perform a total shift of S while the multiplexers of the part PT2 perform a total shift of S+N−R. The first part PT1 comprises at the level of each shift stage a first group of adjacent multiplexers. The second part PT2 comprises at the level of each stage a second group of adjacent multiplexers.

The control means or circuitry MC1 control in an independent manner the two groups of multiplexers of each stage and in an identical manner all the multiplexers of a group of a stage, so as to obtain the total shifts mentioned above.

The number of multiplexers of the first group (that is to say belonging to the first part PT1) of a stage of rank i is equal to min(MX, N−(mod(S+N−R, $2^i$)−(N−R))) where mod (X, Y) denotes the remainder after dividing X by Y, min denotes the "minimum" function and MX denotes the number of multiplexers of the stage of rank i.

Figure 14:
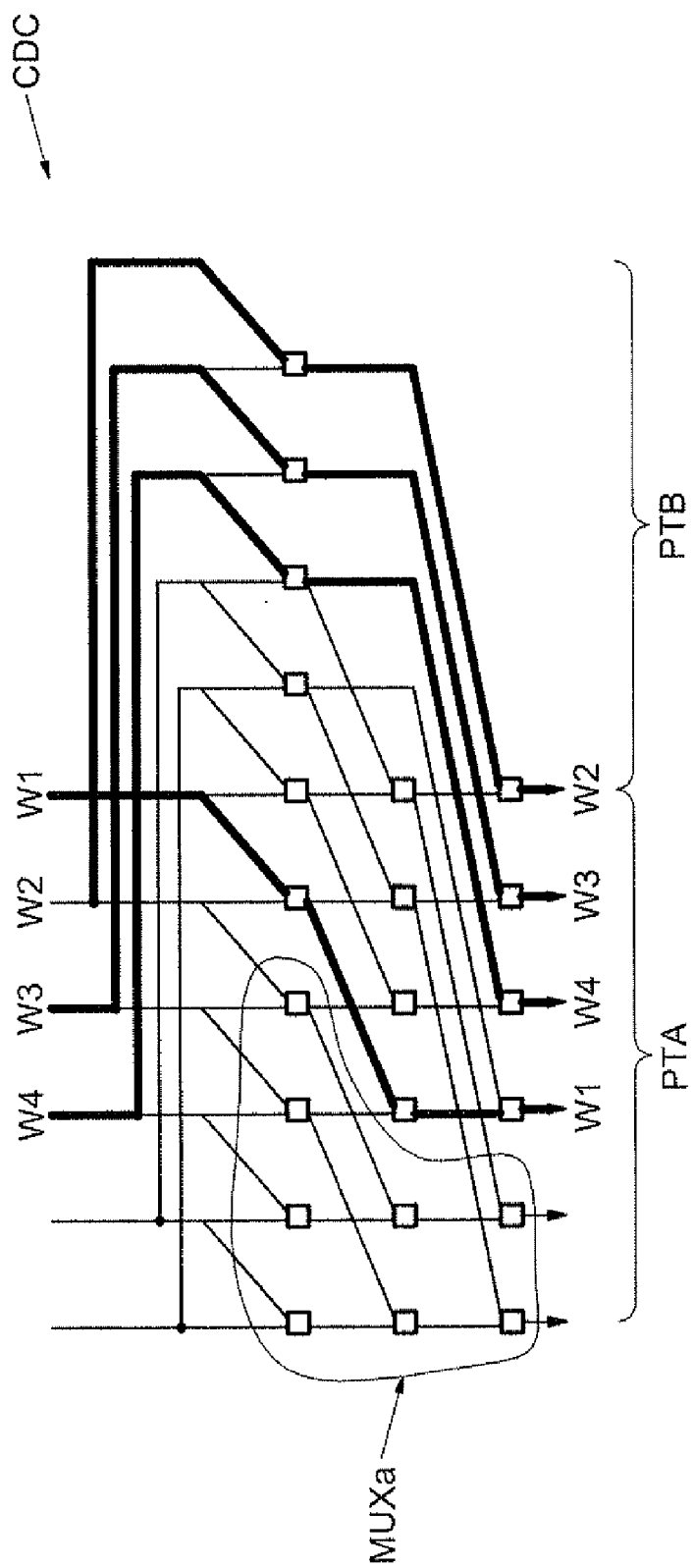

More particularly, in the case of FIGS. 13 and 14, N is equal to 6, R is equal to 4 and S is equal to 3. In these figures, a logic control signal equal to 1 signifies that a multiplexer is in its shift state ETT2, while a logic control signal equal to 0 signifies that a multiplexer is in its non-shift state ETT1. Consequently, the number of stages is equal to 3 and the first part PT1 of the first stage ST1 comprises seven multiplexers.

Moreover the stage ET1 comprises ten multiplexers in total, and the part PT2 comprises for this stage ET1 three multiplexers. All the six multiplexers of the stage ET2 form part of the part PT1. Finally, the part PT1 of the stage ET3 comprises three multiplexers as well as the part PT2.

The multiplexers of the part PT1 may perform a total shift equal to 3. Consequently, as the elementary shift performed by the multiplexers of the stage ET1 is equal to 1 like that performed by the multiplexers of the stage ET2 is equal to 2, it is the multiplexers of the part PT1 of the stages ET1 and ET2 which are controlled so as to be in their state ETT2, that is to say in their shift state, while the multiplexers of the part PT1 of the stage ET3 are controlled so as to be in their state ETT1, that is to say in their state where they do not shift the data item.

The multiplexers of the part PT2 may globally perform a shift equal to 3+6−4, that is to say 5. This overall shift of 5 is obtained through an elementary shift of 1 (multiplexers of the part PT2 of the stage ET1) and through an elementary shift of 4 obtained by means of the multiplexers of the part PT2 of the stage ET3.

The configuration of the multiplexers is illustrated in bold characters in FIG. 14. Of course, since in the example which is mentioned here the data are delivered on the outputs of the ranks 1 to R, that is to say on the outputs S1 to S4, the path of the data W2, W3 and W4 by way of the multiplexers MUXa of FIG. 14 is unimportant.

In FIG. 15, N is equal to 6, R is equal to 5 and S is equal to 1. Consequently, the first stage ET1 comprises in its part PT1 seven multiplexers (1$^{st}$ group) and in its part PT2 three multiplexers (second group). The stage ET2 comprises in its part PT1 five multiplexers and in its part PT2 one multiplexer. The same holds for the stage ET3.

The overall shift performed by the multiplexers of the part PT1 is equal to 1, this being obtained through the multiplexers of the first stage. The overall shift performed by the multiplexers of the part PT2 is equal to 2, this being obtained through the multiplexer of the part PT2 of the stage ET2.

Figure 16:
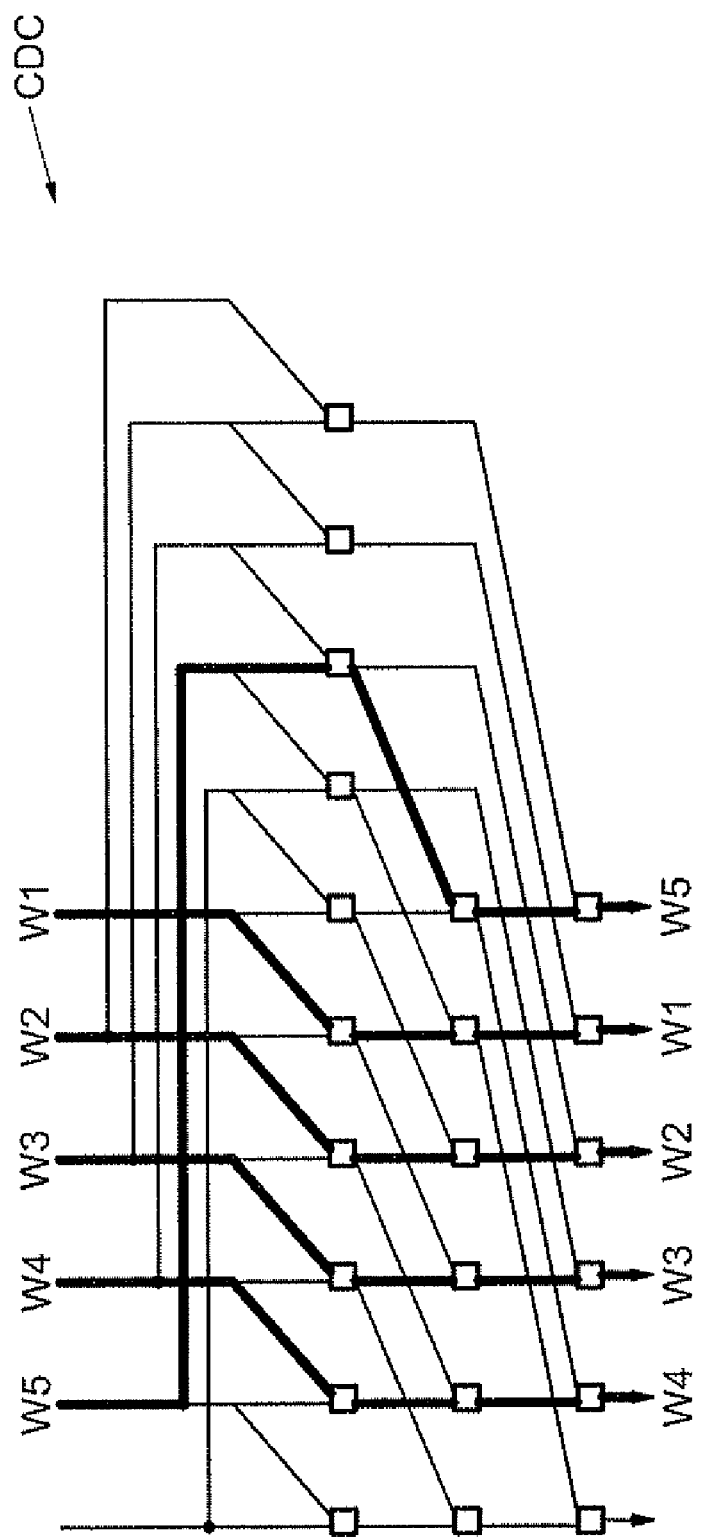

The path of the data W1-W5 is consequently illustrated in bold characters in FIG. 16.

Figure 17:
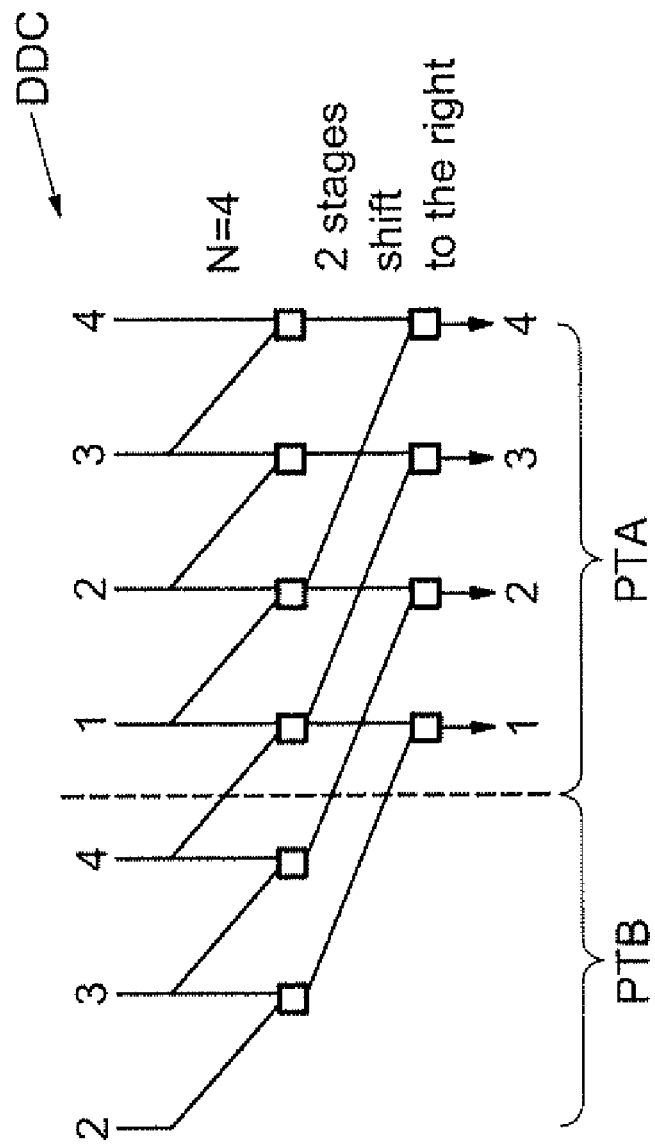
Figure 18:
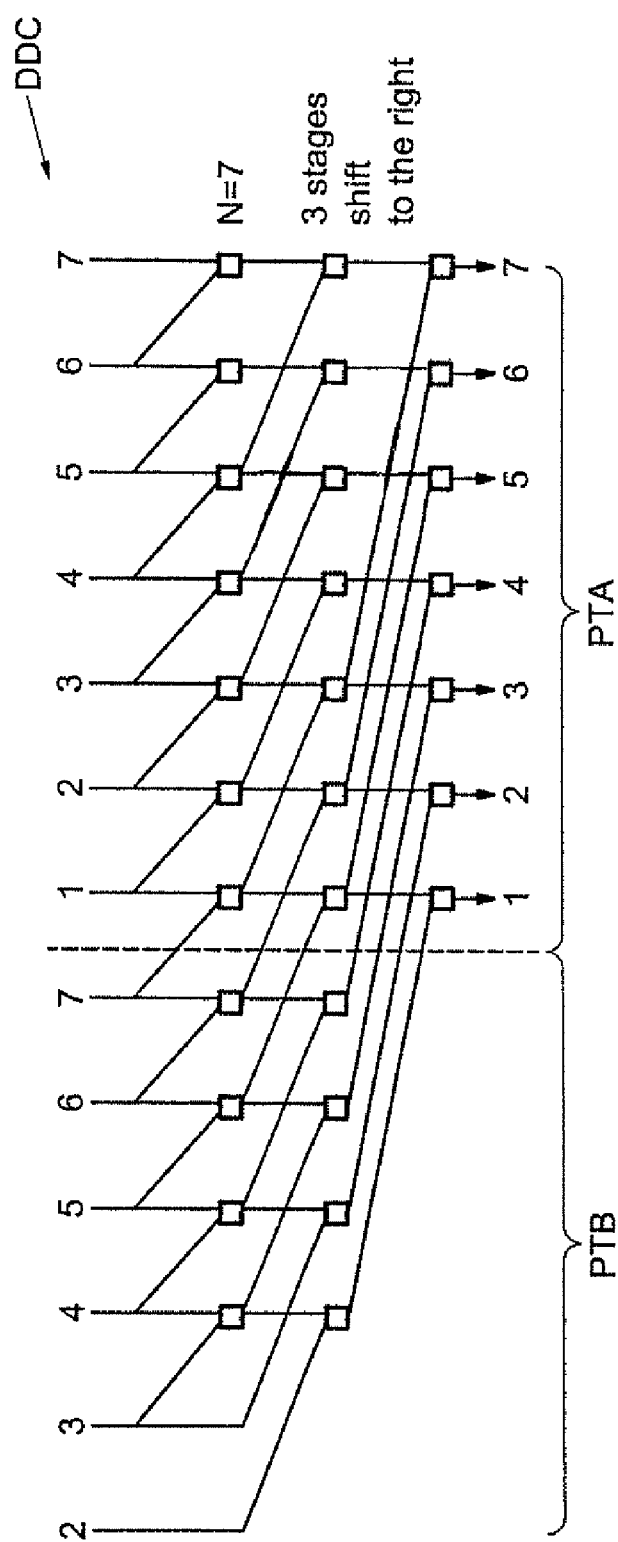

Hardware-wise, the control means or circuitry MC1 can be readily embodied on the basis of gates and/or logic circuits as a function of the values of S, N and R. Everything that has just been described also applies to a shift device capable of performing a right shift as illustrated, for example, in two particular cases in FIGS. 17 and 18.

In fact, as seen in these examples, the structure of such a device DDC capable of performing a right shift has a symmetric architecture with respect to that illustrated in the previous figures.

And, in the case of a right shift, the first elementary inputs of the N multiplexers of rank 1 to N are once again respectively connected directly or indirectly to the N inputs of rank 1 to N. The second elementary input of the multiplexer of rank 1 is still connected to the input of rank N.

Moreover in these two figures, the R predetermined outputs are the outputs of rank 1 to R (which this time are the R left outputs in these figures).

In everything described above, it has been assumed that the data were coded on a single bit. That said, the approach also applies to data coded in a more general manner on several bits. In this case, if the data are coded on a number nbit, each multiplexer MUX is replaced with a set of nbit multiplexers in parallel and each connected in an identical manner.

The arrangement and the configuration, as well as the control of the various multiplexers of the shift circuit, depend not only on the number of intermediate sizes capable of being handled, that is to say the number N, but also on the choice of the inputs on which the R input data are received and on the choice of the R predetermined outputs of the shift device. Specifically, it is quite possible to envisage outputting the R data for an intermediate size of less than N out of R outputs, that admittedly are predetermined, whatever the desired overall shift value, but that differ from the outputs S1 to SR. Likewise it is possible to receive the R input data on R inputs that differ from the inputs E1 to ER.

The person skilled in the art will therefore be able to configure the shift circuit on a case by case basis and connect it between the N inputs and the N outputs as a function of the application envisaged, employing of course the general principles mentioned above and relating to the number of shift stages, to the number of multiplexers per shift stage, to the identical direction of shift for all the multiplexers as well as to group-wise control of the multiplexers as a function of an appropriate partitioning.

The approach may find a beneficial application within the framework of systems operating according to wireless transmission standards such as for example the IEEE 802.16e standard intended for systems dubbed "Fixed and Mobile Broadband Wireless Access Systems" or else the IEEE 802.11n standard relating to networks dubbed "Local and Metropolitan Networks".

Figure 19:
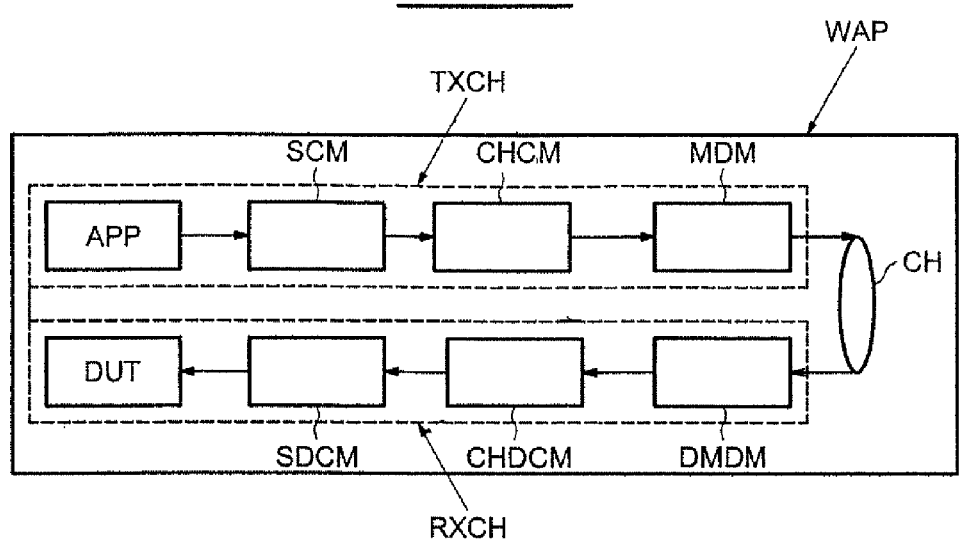
FIG. 19 schematically illustrates the internal structure of a communication chain, for example of a wireless apparatus, incorporating channel coding and decoding means or circuitry according to the present invention.

Mention may also be made of the DVB-S2 standard in particular for satellite transmissions. Such systems use channel coding and decoding means or circuitry which can advantageously incorporate shift devices such as described above. More precisely, in FIG. 19, the reference WAP denotes a wireless apparatus usable in a communication system in accordance with the DVB-S2 standard.

The wireless apparatus WAP comprises a transmission chain TXCH capable of transmitting coded and modulated information on a transmission channel CH, for example, the air. Moreover, this apparatus WAP also comprises a reception chain RXCH capable of receiving and decoding information originating from the transmission channel CH. The transmission chain TXCH comprises in a conventional manner known per se source coding means or circuitry SCM receiving application data APP so as in particular to compress them in order to reduce the data throughput.

The transmission chain also comprises channel coding means or circuitry whose function is, in particular, to add redundancy so as to be able to subsequently correct the potential reception errors due to the noise of the transmission channel. These channel coding means or circuitry comprise, for example, LDPC coding means or circuitry.

The transmission chain also comprises modulation means or circuitry MDM so as to adapt the signal to the transmission channel (satellite channel or radio channel, for example).

The reception chain RXCH comprises homologous means or circuitry performing the inverse functions. More precisely, there are demodulation means or circuitry DMDM, followed by channel decoding means or circuitry CHDCM comprising, for example, an LDPC decoder, followed by source decoding means or circuitry SDCM delivering to the user the user data DUT corresponding to the application data APP.

The LDPC code is a code based on blocks. The encoder processes blocks of K bits and delivers blocks of N bits. Thus, N-K redundancy bits are added. These N-K bits are called "parity bits".

The coding rate (or "code rate") is defined by the ratio K/N. The lower the coding rate, the higher the number of redundancy bits and thus the greater the protection against the noise of the transmission channel.

These N-K bits are calculated with the aid of a parity matrix H. The LDPC code is therefore also a code based on a matrix. This matrix has N-K rows and N columns and includes "1"s and "0"s with a small number of "1"s with respect to the number of "0"s. This is the reason why codes of this type based on such a matrix are dubbed "LDPC codes", that is to say low density codes. The encoded block BLC, of N bits, is calculated by solving the equation $HBLC^T=0$, where H denotes the parity matrix, and T the "transpose" function.

On the decoder side, the correction of the erroneous bits is performed on the basis of the relations between the coded information of the block. These relations are given by the parity matrix H. The decoder uses internal metrics corresponding to the "1"s of the matrix H. The matrix H corresponds to the Tanner graph of the LDPC code comprising so-called check nodes and bit nodes linked together by the path of the graphs representative of the messages iteratively exchanged between the nodes thus linked. These metrics are updated in rows (updating of the check nodes) taking into account the internal metrics of one and the same row. Thereafter, the decoder updates these metrics in columns (updating of the bit nodes) taking into account the internal metrics on one and the same column as well as the corresponding item of information at the input of the decoder and originating from the transmission channel. An iteration corresponds to the updating of the check nodes for all the internal metrics followed by the updating of the bit nodes for all the internal metrics.

The decoding of a block uses several iterations. The values of the decoded bits, also called "hard decisions," are obtained by adding together the internal metrics column-wise with the information received and by taking the sign of the result. Stated otherwise, the sign of the result provides the value "0" or "1" of the bit while the absolute value of the result gives a confidence indication (probability) for this "0" or "1" logic value.

Codes of the LDPC type are beneficial since they make it possible to obtain a very low bit error rate (BER), because of the iterative nature of the decoding algorithm. Several iterative decoding algorithms exist for decoding LDPC codes. Mention may in particular be made of the conventional so-called "Belief Propagation" (BP) algorithm well known to one of ordinary skill in the art.

Figure 20:
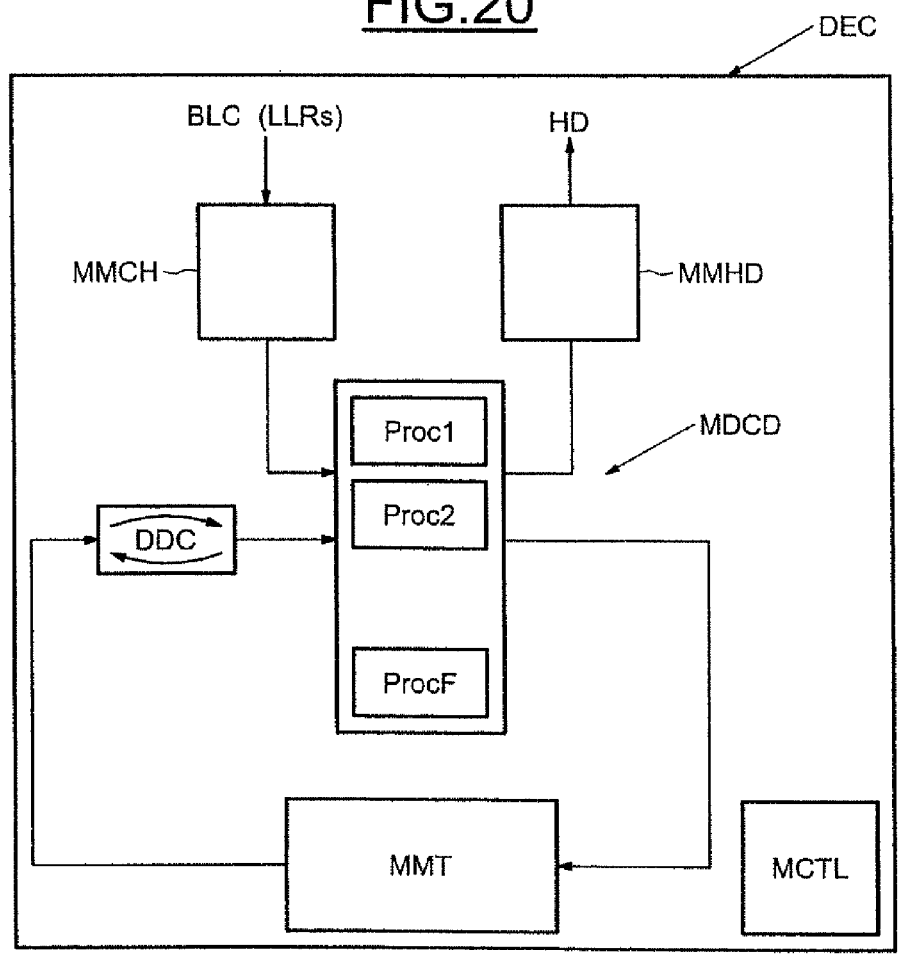
FIG. 20 illustrates in greater detail, but still in a diagrammatic manner, an embodiment of an LDPC decoder incorporating a data shift device according to the present invention.

Referring now more particularly to FIG. 20, it is seen that an exemplary LDPC decoder, referenced DEC, comprises input memory means or circuitry MMCH, decoding means or circuitry MDCD, output memory means or circuitry MMHD as well as checking means or circuitry MCTL.

The input memory means or circuitry MMCH receive a succession of blocks $BLC_i$ encoded with an LDPC code. Each block comprises a predetermined number of coded items of information, 64 800 in the DVB-S2 standard.

These information items are in fact probability ratios and are known generally by one of ordinary skill in the art by the name LLR ("Log Likelihood Ratio"). These information items are coded on n bits. The sign of each item of information is representative of its logic value while its absolute value is representative of the confidence that the logic value of this item of information is the correct one.

Each block received $BLC_i$ is decoded in the decoding means or circuitry MDCD comprising in this example F processors operating in parallel, F being equal to 360 in an application to the DVB-S2 standard.

The battery of F processors performs the updating of the check nodes and of the bit nodes. A metrics memory MMT contains the internal metrics (equal in number to the number of "1"s in the parity matrix). A shift device DDC such as that described above makes it possible to place the correct data opposite the correct processors.

During the iterative decoding, the channel information, initialized by the information of the block to be decoded, is updated with the aid of the updated metrics. Finally, on completion of the decoding, the processors deliver in the memory MMHD, the hard decisions corresponding to the decoded logic values of the block $BLC_i$. These hard decisions are in fact the signs of the channel information updated at the last iteration.

The use of a shift device DDC such as described above, whether it be within the channel coding or channel decoding means or circuitry, makes it possible to reduce the number of multiplexers. Specifically, by way of example, in the 802.11n standard the bus sizes that have to be capable of being handled are equal to 81, 54 and 27.

The use of a conventional barrel shift circuit of size 81 leads to a number of multiplexers equal to 3402 with data coded on 6 bits. A barrel shift circuit of size 54 comprises 1944 multiplexers. A barrel shift circuit of size 27 has 810 multiplexers.

Consequently, an option envisaging three conventional barrel shift circuits having respectively a size equal to 81, 54 and 27 so as to be able to support the three sizes used by the 802.11n standard leads to a total number of multiplexers equal to 6156 to which may be added a selection circuit.

On the other hand, a data shift device according to an embodiment exhibiting a maximum size equal to 81 and capable of processing all the sizes from 1 to 81 leads to a total number of multiplexers of 5526 (with data coded on 6 bits)

With regard to the 802.16e standard, the number of modes is much bigger, typically equal to 19. More precisely, the size of the data bus can vary from 24 to 96. By way of indication, with data coded on 6 bits, the size of a standard barrel circuit of size 96 hence capable of covering only a single mode namely the maximum mode, has in total a number of multiplexers equal to 4032.

By way of comparison, a data shift device such as that described above and which would be capable of covering all the sizes from 1 to 96 and hence all the possible modes of the 802.16e standard would have a number of multiplexers equal to 6540, i.e. barely more than 1.6 times the number of multiplexers of the conventional barrel circuit handling only the size 96.

That which is claimed is:

1. An electronic device comprising:
    N inputs configured to receive R input data, R being able to take values from 1 to N;
    N outputs; and
    a configurable shift circuit coupled between the N inputs and N outputs and comprising
        a cascade of shift stages,
            each shift stage comprising at least N controllable multiplexers,
            each multiplexer including first and second elementary inputs respectively coupled to a first input and a second input taken from among the N inputs so as to, on command, not shift a data item present on the first elementary input and shift a data item present on the second elementary input by an elementary shift value dependent on a rank of the shift stage, a direction of the shift being identical for each multiplexer, and
            control circuitry configured to control the multiplexers to deliver the R input data on R outputs.

2. An electronic device according to claim 1, wherein the number of shift stages is equal to ceil(log$_2$(N)) and ceil(X) denotes a smallest integer greater than X.

3. An electronic device according to claim 1, wherein each shift stage comprises a number of multiplexers equal to N+($2^i$*floor((N−$2^{i-1}$−1)/$2^i$))) and floor(X) denotes a highest integer less than or equal to X; and wherein i denotes the rank of the shift stage, a first shift stage having rank i equal to 1.

4. An electronic device according to claim 1, wherein one of the N inputs is coupled directly to two multiplexers and each other N input of successive ranks is coupled directly to at least three different multiplexers so that a data item present on one other input can be shifted in a direction of the shift by an overall shift value less than N and compatible with a rank of the N input.

5. An electronic device according to claim 4, wherein the other inputs are of rank 2 to N and each of these inputs is coupled directly to at least three multiplexers so that a data item present on one of these inputs can be shifted in the direction of the shift by an overall shift value lying between N−1 and N−r+1; and wherein r denotes a rank of an input.

6. An electronic device according to claim 1, wherein the elementary shift value of a stage of rank i is identical for the multiplexers of the stage of rank i and is equal to $2^{i-1}$, a first stage being a stage of rank i equal to 1, and the second elementary inputs of all multiplexers of a stage are respectively coupled to inputs of consecutive ranks.

7. An electronic device according to claim 1, wherein a last stage comprises N multiplexers.

8. An electronic device according to claim 7, wherein the first elementary inputs of N multiplexers of ranks 1 to N of a stage of rank i are respectively coupled to the N inputs of ranks 1 to N; and wherein the second elementary input of a multiplexer of rank 1 of a stage of rank i equal to 1 is coupled to an input of rank N; and wherein the first and second elementary inputs of other multiplexers of the stage of rank i are coupled to at least one input of rank N to 2 with respect to an elementary shift value associated with this stage; and wherein second elementary inputs of at least one of the N multiplexers of the last stage are also coupled to inputs of rank N to 2 having regard to the elementary shift value associated with this stage.

9. An electronic device according claim 1, wherein each shift stage comprises a first group of adjacent multiplexers and a second group of adjacent multiplexers, a number of multiplexers in each group based upon a rank of the stage and a value S+N−R where S denotes a desired overall shift value and R denotes a rank of an input; and wherein the control circuitry is configured to control in an independent manner the first and second groups of adjacent multiplexers of each stage, and in a same manner multiplexers of a group of a stage, so that multiplexers of first groups of adjacent multiplexers of each shift stage effect a shift equal to S and that multiplexers of all second groups of adjacent multiplexers of each shift stage effect a shift equal to S+N−R.

10. An electronic device according to claim 9, wherein a number of multiplexers of the first group of adjacent multiplexers of a stage of rank i is equal to min (MX, N−(mod(S+N−,$2^i$)−(N−R))), mod(S+N−R,$2^i$) representing a remainder after dividing S+N−R by $2^i$, min representing a "minimum" function, and MX representing a number of multiplexing means of the stage of rank i.

11. An electronic device according to claim 1, wherein the configurable shift circuit is incorporated in an integrated circuit.

12. An electronic device according to claim 1, wherein the configurable shift circuit defines a channel coding device able to perform an encoding with a low-density parity-check (LDPC) code.

13. An electronic device according to claim 1, wherein the configurable shift circuit defines a channel decoding device able to perform a decoding of blocks encoded with an LDPC code.

14. An electronic device comprising:
    N inputs to receive R input data, R being able to take values from 1 to N;
    N outputs; and
    a configurable shift circuit coupled between the N inputs and N outputs and comprising
        a cascade of shift stages, the number of shift stages being equal to ceil(log$_2$(N)) where ceil(X) denotes a smallest integer greater than X,
        each shift stage comprising N+($2^i$*floor((N−$2^{i-1}$−1)/$2^i$))) controllable multiplexers where floor(X) denotes a highest integer less than or equal to X and i denotes the rank of the shift stage, a first shift stage having rank i equal to 1,
        each multiplexer including first and second elementary inputs respectively coupled to a first input and a second input taken from among the N inputs so as to, on command, not shift a data item present on the first elementary input and shift a data item present on the second elementary input by an elementary shift value dependent on a rank of the shift stage, a direction of the shift being identical for each multiplexer, and
        control circuitry configured to control the multiplexers to deliver the R input data on R outputs.

15. An electronic device according to claim 14, wherein one of the N inputs is coupled directly to two multiplexers and each other N input of successive ranks is coupled directly to at least three different multiplexers so that a data item present on one other input can be shifted in a direction of the shift by an overall shift value less than N and compatible with a rank of the N input.

16. An electronic device according to claim 15, wherein the other inputs are of rank 2 to N and each of these inputs is coupled directly to at least three multiplexers so that a data item present on one of these inputs can be shifted in the direction of the shift by an overall shift value lying between N−1 and N−r+1; and wherein r denotes a rank of an input.

17. An electronic device according to claim 14, wherein the elementary shift value of a stage of rank i is identical for the multiplexers of the stage of rank i and is equal to $2^{i-1}$, a first stage being a stage of rank i equal to 1, and the second elementary inputs of all multiplexers of a stage are respectively coupled to inputs of consecutive ranks.

18. An electronic device according claim 14, wherein a last stage comprises N multiplexers.

19. An electronic device according to claim 18, wherein the first elementary inputs of N multiplexers of ranks 1 to N of a stage of rank i are respectively coupled to the N inputs of ranks 1 to N; and wherein the second elementary input of a multiplexer of rank 1 of a stage of rank i equal to 1 is coupled to an input of rank N; and wherein the first and second elementary inputs of other multiplexers of the stage of rank i are coupled to at least one input of rank N to 2 with respect to an elementary shift value associated with this stage; and wherein second elementary inputs of at least one of the N multiplexers of the last stage are also coupled to inputs of rank N to 2 having regard to the elementary shift value associated with this stage.

20. An electronic device according claim 14, wherein each shift stage comprises a first group of adjacent multiplexers and a second group of adjacent multiplexers, a number of multiplexers in each group based upon a rank of the stage and a value S+N−R where S denotes a desired overall shift value and R denotes a rank of an input; and wherein the control circuitry is able to control in an independent manner the first and second groups of adjacent multiplexers of each stage, and in a same manner multiplexers of a group of a stage, so that multiplexers of first groups of adjacent multiplexers of each shift stage effect a shift equal to S and that multiplexers of all second groups of adjacent multiplexers of each shift stage effect a shift equal to S+N−R.

21. An electronic device according to claim 14, wherein the configurable shift circuit is incorporated in an integrated circuit.

22. A method of operating a configurable shift circuit coupled between N inputs able to receive R input data with R being a value from 1 to N, and N outputs, the configurable shift circuit comprising a cascade of shift stages, each comprising at least N controllable multiplexers each having first and second elementary inputs respectively coupled to first and second inputs taken from among the N inputs, the method comprising:
controlling the multiplexers to not shift a data item present on the first elementary input and to shift a data item present on the second elementary input by an elementary shift value dependent on a rank of the shift stage, a direction of the shift being identical for each multiplexer; and
controlling the multiplexers to deliver the R input data on R outputs.

23. A method according claim 22, further comprising coupling one of the N inputs directly to two multiplexers and coupling each other N input of successive ranks directly to at least three different multiplexers so that a data item present on one other input can be shifted in a direction of the shift by an overall shift value less than N and compatible with a rank of the N input.

24. A method according to claim 23, wherein the other inputs are of rank 2 to N; and further comprising coupling each of the other inputs directly to at least three multiplexers so that a data item present on one of the other inputs can be shifted in the direction of the shift by an overall shift value lying between N−1 and N−r+1, r denoting a rank of an input.

25. A method according to claim 22, further comprising coupling the first elementary inputs of N multiplexers of ranks 1 to N of a stage of rank i respectively to the N inputs of ranks 1 to N, coupling the second elementary input of a multiplexer of rank 1 of a stage of rank i equal to 1 to an input of rank N, coupling the first and second elementary inputs of other multiplexers of the stage of rank i to at least one input of rank N to 2 with respect to an elementary shift value associated with this stage, and coupling second elementary inputs of at least one of the N multiplexers of a last stage comprising N multiplexers are to inputs of rank N to 2 having regard to the elementary shift value associated with this stage.

* * * * *

UNITED STATES PATENT AND TRADEMARK OFFICE
CERTIFICATE OF CORRECTION

| | |
|---|---|
| PATENT NO. | : 8,126,022 B2 |
| APPLICATION NO. | : 12/117060 |
| DATED | : February 28, 2012 |
| INVENTOR(S) | : Laurent Paumier and Vincent Heinrich |

It is certified that error appears in the above-identified patent and that said Letters Patent is hereby corrected as shown below:

In the Specifications:

Column 4, Line 50    Delete: "N-2"
                     Insert: -- N-1 --

Column 5, Line 14    Delete: "E3"
                     Insert: -- E3a --

Column 7, Line 34    Delete: "ST1"
                     Insert: -- ET1 --

Signed and Sealed this
Seventh Day of May, 2013

Teresa Stanek Rea
*Acting Director of the United States Patent and Trademark Office*